United States Patent
Tran

(10) Patent No.: US 7,294,903 B2
(45) Date of Patent: Nov. 13, 2007

(54) TRANSISTOR ASSEMBLIES

(75) Inventor: Luan C. Tran, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/216,915

(22) Filed: Aug. 31, 2005

(65) Prior Publication Data

US 2005/0285163 A1    Dec. 29, 2005

Related U.S. Application Data

(62) Division of application No. 10/071,453, filed on Feb. 8, 2002, now Pat. No. 7,057,257, which is a division of application No. 09/834,660, filed on Apr. 12, 2001, which is a division of application No. 09/388,857, filed on Sep. 1, 1999, now Pat. No. 7,189,609.

(51) Int. Cl.
   *H01L 21/00*    (2006.01)

(52) U.S. Cl. .................. 257/510; 257/288; 257/365

(58) Field of Classification Search ............... 257/510, 257/288, 365
   See application file for complete search history.

(56) References Cited

U.S. PATENT DOCUMENTS

| | | |
|---|---|---|
| 4,943,537 A | 7/1990 | Harrington, III |
| 4,987,093 A | 1/1991 | Teng et al. |
| 5,111,069 A | 5/1992 | Deierling et al. |
| 5,130,268 A | 7/1992 | Liou et al. |
| 5,410,176 A | 4/1995 | Liou et al. |
| 5,422,507 A | 6/1995 | Wanlass |

(Continued)

FOREIGN PATENT DOCUMENTS

JP    P2000-77678 A    3/2000

OTHER PUBLICATIONS

S. Wolf, Silicon Processing for the VLSI Era, vol. 3—The Submicron MOSFET, © 1995 Lattice Press, pp. 330, 331, 366 and 367.

(Continued)

*Primary Examiner*—Laura M. Schillinger
(74) *Attorney, Agent, or Firm*—Wells St. John, P.S.

(57) ABSTRACT

Semiconductor processing methods of forming transistors, semiconductor processing methods of forming dynamic random access memory circuitry, and related integrated circuitry are described. In one embodiment, active areas are formed over a substrate, with one of the active areas having a width of less than one micron, and with some of the active areas having different widths. A gate line is formed over the active areas to provide transistors having different threshold voltages. Preferably, the transistors are provided with different threshold voltages without using a separate channel implant for the transistors. In another embodiment, a plurality of shallow trench isolation regions are formed within a substrate and define a plurality of active areas having widths at least some of which being no greater than about one micron (or less), with some of the widths preferably being different. One or more gate lines may be coupled to the respective active areas to provide individual transistors, with the transistors corresponding to the active areas having the different widths having different threshold voltages. In another embodiment, two field effect transistors are fabricated having different threshold voltages without using a separate channel implant for one of the transistors versus the other.

18 Claims, 2 Drawing Sheets

U.S. PATENT DOCUMENTS

| | | | |
|---|---|---|---|
| 5,447,884 A | 9/1995 | Fahey et al. | |
| 5,492,858 A | 2/1996 | Bose et al. | |
| 5,493,251 A | 2/1996 | Khambaty et al. | |
| 5,498,565 A | 3/1996 | Gocho et al. | |
| 5,665,202 A | 9/1997 | Subramanian et al. | |
| 5,691,215 A | 11/1997 | Dai et al. | |
| 5,702,976 A | 12/1997 | Schuegraf et al. | |
| 5,717,635 A | 2/1998 | Akatsu | |
| 5,721,172 A | 2/1998 | Jang et al. | |
| 5,721,173 A | 2/1998 | Yano et al. | |
| 5,728,621 A | 3/1998 | Zheng et al. | |
| 5,732,014 A | 3/1998 | Forbes | |
| 5,811,347 A | 9/1998 | Gardner et al. | 438/435 |
| 5,817,567 A | 10/1998 | Jang et al. | |
| 5,821,591 A | 10/1998 | Krautschneider et al. | |
| 5,851,899 A | 12/1998 | Weigand | |
| 5,851,900 A | 12/1998 | Chu et al. | |
| 5,866,934 A | 2/1999 | Kadosh et al. | |
| 5,869,396 A | 2/1999 | Pan et al. | |
| 5,872,043 A | 2/1999 | Chen | |
| 5,880,007 A | 3/1999 | Varian et al. | |
| 5,892,707 A | 4/1999 | Noble | |
| 5,897,351 A | 4/1999 | Forbes | |
| 5,920,276 A | 7/1999 | Frederick | 342/26 B |
| 5,923,993 A | 7/1999 | Sahota | |
| 5,926,723 A | 7/1999 | Wang | |
| 5,950,091 A | 9/1999 | Fulford, Jr. et al. | |
| 5,960,276 A * | 9/1999 | Liaw et al. | 438/224 |
| 5,994,178 A | 11/1999 | Wu | |
| 5,994,198 A | 11/1999 | Hsu et al. | |
| 6,001,740 A | 12/1999 | Varian et al. | |
| 6,009,023 A | 12/1999 | Lu et al. | 365/189.11 |
| 6,025,623 A | 2/2000 | Sunouchi et al. | |
| 6,028,784 A | 2/2000 | Mori et al. | |
| 6,037,671 A | 3/2000 | Kepler et al. | |
| 6,048,765 A | 4/2000 | Wu | |
| 6,048,771 A | 4/2000 | Lin et al. | |
| 6,048,775 A | 4/2000 | Yao et al. | |
| 6,057,207 A | 5/2000 | Lin et al. | |
| 6,057,210 A | 5/2000 | Yang et al. | |
| 6,060,394 A | 5/2000 | Wu | |
| 6,071,792 A | 6/2000 | Kim et al. | |
| 6,107,134 A | 8/2000 | Lu et al. | |
| 6,121,651 A | 9/2000 | Furukawa et al. | |
| 6,124,183 A | 9/2000 | Karlsson et al. | |
| 6,133,055 A | 10/2000 | Yeh | |
| 6,133,098 A | 10/2000 | Ogura et al. | |
| 6,153,467 A | 11/2000 | Wu | |
| 6,156,620 A | 12/2000 | Puchner et al. | |
| 6,159,822 A | 12/2000 | Yang et al. | |
| 6,171,929 B1 | 1/2001 | Yang et al. | |
| 6,177,324 B1 | 1/2001 | Song et al. | |
| 6,180,458 B1 | 1/2001 | Krautschneider et al. | |
| 6,191,446 B1 | 2/2001 | Gardner et al. | |
| 6,228,713 B1 | 5/2001 | Pradeep et al. | |
| 6,236,079 B1 | 5/2001 | Nitayama et al. | |
| 6,261,883 B1 | 7/2001 | Koubuchi et al. | |
| 6,261,914 B1 | 7/2001 | Divakaruni et al. | |
| 6,265,282 B1 | 7/2001 | Lane et al. | |
| 6,278,295 B1 | 8/2001 | Lovett | |
| 6,281,082 B1 | 8/2001 | Chen et al. | |
| 6,294,422 B1 | 9/2001 | Sunouchi et al. | |
| 6,297,082 B1 | 10/2001 | Lin et al. | |
| 6,297,129 B2 | 10/2001 | Tran et al. | |
| 6,309,942 B1 | 10/2001 | Tsui et al. | |
| 6,312,997 B1 | 11/2001 | Tran | |
| 6,323,082 B1 | 11/2001 | Furukawa et al. | |
| 6,329,251 B1 | 12/2001 | Wu | |
| 6,351,019 B1 | 2/2002 | DeBrosse et al. | |
| 6,353,242 B1 | 3/2002 | Watanabe et al. | |
| 6,391,756 B1 | 5/2002 | Pan et al. | |
| 6,403,484 B1 | 6/2002 | Lim et al. | |
| 6,411,555 B1 | 6/2002 | Tran | |
| 6,420,749 B1 | 7/2002 | Divakaruni et al. | |
| 6,423,620 B2 | 7/2002 | Pan et al. | |
| 6,426,534 B1 | 7/2002 | Look et al. | |
| 6,429,081 B1 | 8/2002 | Doong et al. | |
| 6,436,751 B1 | 8/2002 | Liou et al. | |
| 6,492,693 B2 | 12/2002 | Tran | |
| 6,501,114 B2 | 12/2002 | Cho et al. | |
| 6,509,595 B1 | 1/2003 | Leung et al. | |
| 6,545,904 B2 | 4/2003 | Tran | |
| 6,573,548 B2 | 6/2003 | Leung et al. | |
| 6,620,704 B2 | 9/2003 | Miura et al. | |
| 6,642,098 B2 | 11/2003 | Leung et al. | |
| 6,649,461 B1 | 11/2003 | Lai et al. | |
| 6,674,134 B2 | 1/2004 | Berry et al. | 257/397 |
| 6,734,487 B2 | 5/2004 | Tran et al. | |
| 6,744,676 B2 | 6/2004 | Leung et al. | |
| 6,770,927 B2 | 8/2004 | Cho et al. | |
| 6,784,048 B2 | 8/2004 | Leung et al. | |
| 6,834,019 B2 | 12/2004 | Tran et al. | |
| 6,902,975 B2 | 6/2005 | Tu | |
| 6,914,287 B2 * | 7/2005 | Tran | 257/305 |
| 7,020,020 B1 | 3/2006 | Lojek | |
| 7,057,257 B2 * | 6/2006 | Tran | 257/510 |
| 7,071,515 B2 * | 7/2006 | Sheu et al. | 257/374 |
| 2001/0012664 A1 * | 8/2001 | Tran | 438/275 |
| 2001/0020724 A1 | 9/2001 | Berry et al. | 257/397 |
| 2001/0052610 A1 | 12/2001 | Leung et al. | |
| 2002/0053691 A1 | 5/2002 | Leung et al. | |
| 2002/0072199 A1 * | 6/2002 | Tran | 438/424 |
| 2002/0195670 A1 * | 12/2002 | Tran | 257/391 |
| 2003/0001181 A1 | 1/2003 | Leung et al. | |
| 2003/0020106 A1 * | 1/2003 | Tran | 257/296 |
| 2003/0151071 A1 | 8/2003 | Leung et al. | |
| 2003/0151072 A1 | 8/2003 | Leung et al. | |
| 2004/0188777 A1 | 9/2004 | Hwang | |
| 2004/0207100 A1 | 10/2004 | Madurawe | |
| 2004/0214355 A1 | 10/2004 | Miura et al. | |
| 2005/0012173 A1 * | 1/2005 | Sheu et al. | 257/519 |
| 2005/0029599 A1 * | 2/2005 | Tran | 257/368 |
| 2005/0258485 A1 | 11/2005 | Kohyama | |
| 2005/0285163 A1 * | 12/2005 | Tran | 257/288 |
| 2005/0285201 A1 * | 12/2005 | Tran | 257/365 |
| 2005/0287733 A1 * | 12/2005 | Tran | 438/222 |
| 2006/0008977 A1 * | 1/2006 | Tran | 438/239 |
| 2006/0062050 A1 | 3/2006 | Lojek | |
| 2006/0079068 A1 * | 4/2006 | Sheu et al. | 438/433 |

OTHER PUBLICATIONS

Wolf et al., "Silicon Processing for the VLSI Era"—vol. 1—Process Technology—Second Edition, © 2000, 6 pages.

Van Zant, Peter, "Microchip Fabrication—Third Edition," © 1997, p. 332.

* cited by examiner

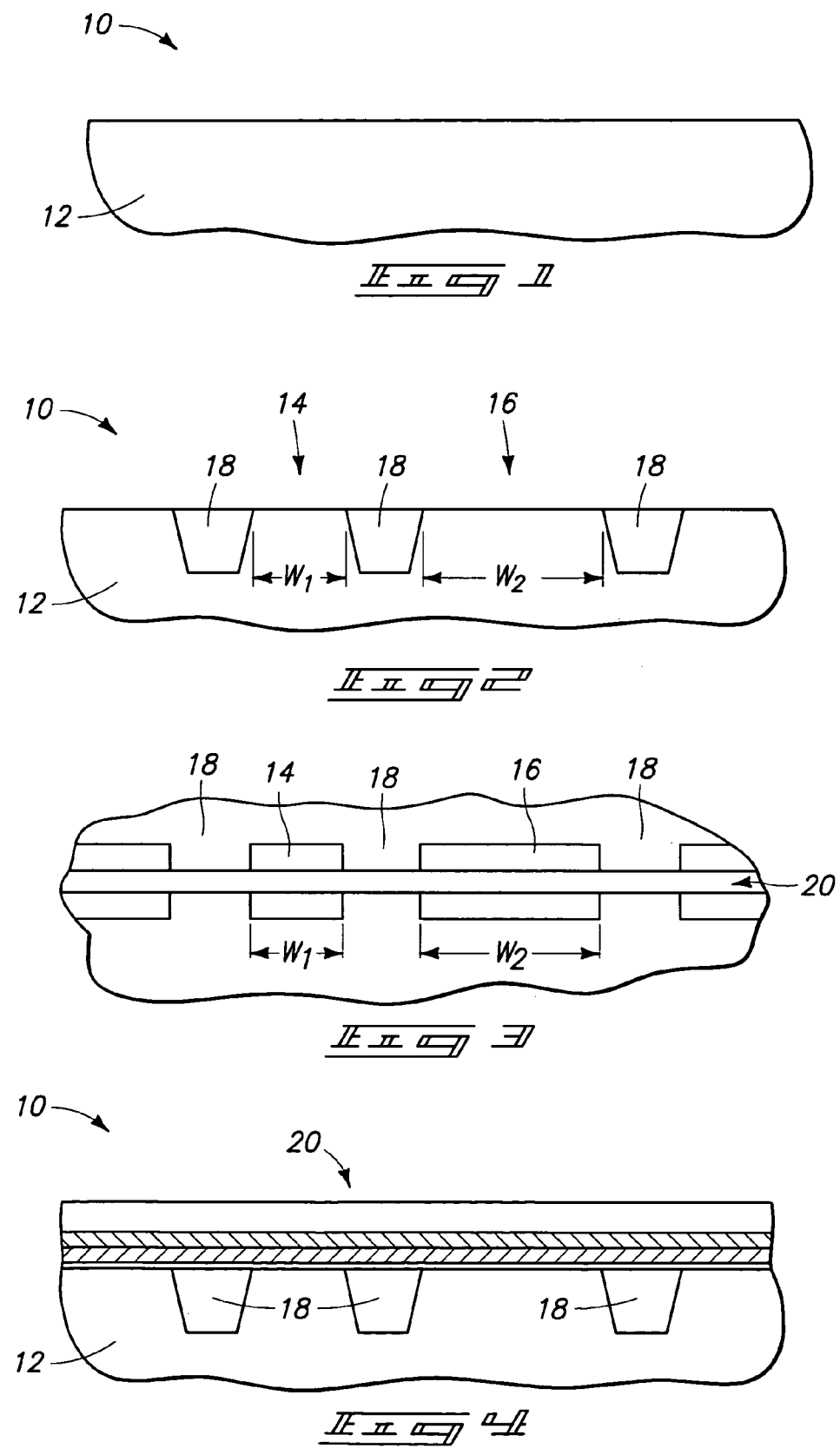

TRANSISTOR ASSEMBLIES

CROSS REFERENCE TO RELATED APPLICATION

This patent application is a divisional application of and claims priority to U.S. patent application Ser. No. 10/071,453, filed Feb. 8, 2002, now U.S. Pat. No. 7,057,257 entitled "Semiconductor Processing Methods Of Forming Transistors, Semiconductor Processing Methods Of Forming Dynamic Random Access Memory Circuitry, And Related Integrated Circuitry", naming Luan C. Tran as inventor, which is also a divisional application of U.S. patent application Ser. No. 09/834,660, filed Apr. 12, 2001, which is a divisional application of U.S. patent application Ser. No. 09/388,857, filed Sep. 1, 1999, now U.S. Pat. No. 7,189,609 the disclosures of which are incorporated herein by reference.

TECHNICAL FIELD

This invention relates to semiconductor processing methods of forming transistors, to semiconductor processing methods of forming dynamic random access memory circuitry, and to related integrated circuitry.

BACKGROUND OF THE INVENTION

Semiconductor processing typically involves a number of complicated steps which include patterning, etching, and doping or implanting steps, to name just a few, which are necessary to form desired integrated circuitry. One emphasis on improving the methods through which integrated circuitry is formed, and which is directed to reducing the processing complexity, relates to reducing the number of processing steps. By reducing the number of processing steps, risks associated with Is processing mistakes entering into the processing flow are reduced. Additionally, wherever possible, it is also highly desirable to reduce processing complexities while providing added flexibility in the processing itself.

For example, several processing steps are required to form transistor constructions. One or more of these steps can include a threshold voltage definition step in which one or more channel implantation steps are conducted to define the threshold voltage for the ultimately formed transistor. In some applications, it is desirable to have transistors with different threshold voltages. Typically, different threshold voltages are provided by additional masking and doping or implanting steps to adjust the doping concentration within the channel region of the various transistors desired to have the different threshold voltage. Specifically, one transistor might be masked while another receives a threshold implant; and then other of the transistors might be masked while the first-masked transistor receives a threshold implant.

This invention grew out of concerns associated with reducing the processing complexities involved in forming transistors having different threshold voltages.

SUMMARY OF THE INVENTION

Semiconductor processing methods of forming transistors, semiconductor processing methods of forming dynamic random access memory circuitry, and related integrated circuitry are described. In one embodiment, active areas are formed over a substrate, with one of the active areas having a width of less than one micron. A gate line is formed over the active areas to provide transistors having different threshold voltages. Preferably, the transistors are provided with different threshold voltages without using a separate channel implant for the transistors. The transistor with the lower of the threshold voltages corresponds to the active area having the width less than one micron.

In another embodiment, a plurality of shallow trench isolation (STI) regions are formed within a substrate and define a plurality of active areas having widths at least some of which are no greater than about one micron, with at least two of the widths preferably being different. A gate line is formed over the respective active areas to provide individual transistors, with the transistors corresponding to the active areas having the different widths having different threshold voltages. In an STI process, devices having width smaller than 1 micron typically also have a lower threshold voltage. This is referred to as "reversed narrow width" effect as contrasted with the case of transistors formed using LOCOS isolation, where threshold voltage tends to increase as device width decreases.

In another embodiment, two field effect transistors are fabricated having different threshold voltages without using a separate channel implant for one of the transistors versus the other.

In yet another embodiment, two series of field effect transistors are formed, with one series being isolated from adjacent devices by shallow trench isolation, the other series having active area widths greater than one micron. The one series is formed to have active area widths less than one micron to achieve lower threshold voltages than the other of the series.

In yet another embodiment, one of the two series of field effect transistors are isolated by shallow trench isolation, and different threshold voltages between the field effect transistors in different series are achieved by varying the active area widths of the field effect transistors in the series. At least one of the series preferably has active area widths less than one micron.

BRIEF DESCRIPTION OF THE DRAWINGS

Preferred embodiments of the invention are described below with reference to the following accompanying drawings.

FIG. 1 is a diagrammatic side sectional view of the semiconductor wafer fragment in process in accordance with one embodiment of the invention.

FIG. 2 is a view of the FIG. 1 wafer fragment at a processing step which is subsequent to that which is shown in FIG. 1.

FIG. 3 is a plan view of the FIG. 1 wafer fragment at a processing step which is subsequent to that which is shown in FIG. 2.

FIG. 4 is a side view of the FIG. 3 wafer fragment.

DETAILED DESCRIPTION OF THE PREFERRED EMBODIMENTS

Figure 5:
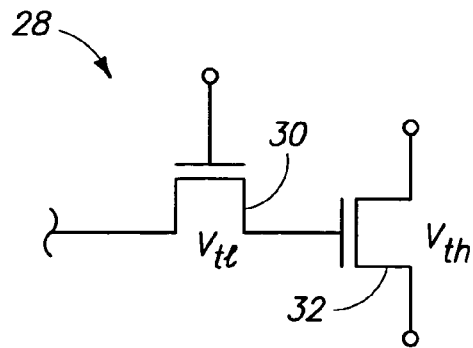
FIG. 5 is a schematic diagram of circuitry formed in accordance with another embodiment of the invention.

This disclosure of the invention is submitted in furtherance of the constitutional purposes of the U.S. Patent Laws "to promote the progress of science and useful arts" (Article 1, Section 8).

Referring to FIG. 1, a semiconductor wafer fragment in process is shown generally at 10, and includes a semiconductive substrate 12. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Referring to FIG. 2, a plurality of active areas are formed over substrate 12, with an exemplary pair of active areas 14, 16 being shown. Active areas 14, 16 can constitute individual active sub-areas within a larger active area. In a preferred embodiment, active areas or sub-areas 14, 16 are defined between a plurality of shallow trench isolation regions 18 which are received within substrate 12. The spacing of shallow trench isolation regions 18 defines a plurality of active area widths, with exemplary widths being shown at $w_1$ and $w_2$. Preferably, at least two of the widths are different from one another. Of course, more than two of the widths could be different from one another.

In one embodiment, some of the active area widths are no greater than about one micron. One micron happens to be a break point that is technologically dependent. In other words, STI transistors show a threshold voltage reduction with reducing gate width when the gate width is about one micron or less. It will be understood that other sizes that correspond to a break point in threshold voltage versus gate width or control element size for transistors made using other technologies could be used instead of "one micron".

In one embodiment, one or both of widths $w_1$ and $w_2$ could be less than one micron. In a preferred embodiment, the different active area widths impart to transistors which are to be formed, different threshold voltages which, in a most preferred embodiment, are achieved without conducting or using a separate channel implant for the different transistors. Such results in a reduction in the number of processing steps which were previously required to form transistors having different threshold voltages.

In one embodiment, the different threshold voltages are each less than two volts. In another embodiment, the different threshold voltages are each less than one volt. In this example, the transistor having the lower of the threshold voltages corresponds to the transistor which is formed relative to the active area having the lesser or smaller active area width.

With respect to provision of the channel implant(s) which defines the threshold voltages, one or more such implants can be conducted relative to the active areas. Preferably, each of the one or more channel implants are common to the transistors having the different active area widths which, in turn, provides transistors having different threshold voltages.

FIG. 3 is a plan view of the FIG. 1 wafer fragment at a processing step which is subsequent to that which is shown in FIG. 2, and FIG. 4 is a side view of the FIG. 3 wafer fragment. A transistor gate line 20 is formed over respective active areas 14, 16 to provide individual transistors, wherein the transistors corresponding to the active areas having the different active area widths have different threshold voltages as discussed above. Gate lines such as line 20 typically have a gate oxide layer, one or more conductive layers such as polysilicon and a silicide layer, one or more insulative caps, and insulative sidewall spacers (not shown), none of which are specifically designated. The illustrated gate line constitutes a common gate line which is formed over the illustrated active areas. It is, of course, possible to form separate gate lines over the active areas having the different widths.

Alternately considered, and in accordance with one embodiment of the present invention, two series of field effect transistors are formed over substrate 12. One of the series of field effect transistors (an exemplary transistor of which being formed over active area 14) is isolated from other adjacent devices by shallow trench isolation regions 18. The other series of field effect transistors (an exemplary transistor of which being formed over active area 16) has active area widths greater than one micron, with the first-mentioned series being formed to have active area widths less than one micron to achieve lower threshold voltages than the other of the series. Preferably, the threshold voltages for the two series of field effect transistors are defined by one or more common channel implants. In a most preferred embodiment, the one or more common channel implants are the only implants which define the threshold voltages for the two series of field effect transistors.

Further and alternately considered, and in accordance with another embodiment of the present invention, the two series of field effect transistors just mentioned include at least one series which is isolated from adjacent devices by shallow trench isolation regions such as regions 18. Different threshold voltages are achieved between field effect transistors in the different series by varying the active area widths of the field effect transistors in the series, with at least one of the series having active area widths less than one micron, or less for future technologies.

Accordingly, field effect transistors can be fabricated having different threshold voltages without using a separate channel implant for the field effect transistors having the different threshold voltages. Such can result in a reduction in processing steps, which formerly included additional masking steps. One or more of the active areas can have widths less than one micron, with such widths being varied in order to change the threshold voltages of the transistors formed thereover.

In operation, various methods of the invention provide integrated circuitry having transistors with different threshold voltages without the added processing complexity. In a preferred embodiment, various methods of the invention can provide dynamic random access memory circuitry having a memory array area for supporting memory circuitry and a peripheral area for supporting peripheral circuitry. A plurality of shallow trench isolation regions are received within the peripheral area of the substrate and define a plurality of active areas having widths within the substrate, some of the widths being no greater than about one micron. Preferably, at least two of the widths are different. A conductive line is formed or disposed over the respective active areas to provide MOS gate electrodes for individual transistors. The transistors corresponding to the active areas having the different widths preferably have different threshold voltages. Exemplary dynamic random access memory circuitry is described in U.S. Pat. Nos. 5,702,990 and 5,686,747, which are incorporated by reference.

Referring to FIG. 5, a circuit 28 is provided and includes transistors 30, 32. Such transistors can be fabricated, in accordance with the methods described above, to have different threshold voltages. In this example, transistor 30 serves as a pass transistor and has a low threshold voltage $V_{t1}$, while transistor 32 serves as a switching transistor and has a high threshold voltage $V_{th}$.

Figure 6:
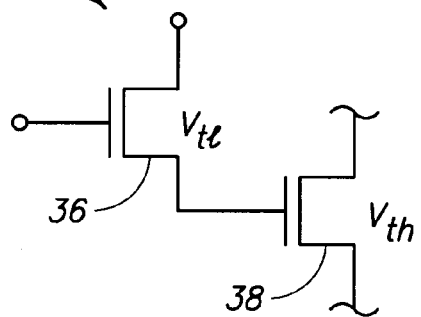
FIG. 6 is a schematic diagram of circuitry formed in accordance with another embodiment of the invention.

Referring to FIG. 6, a circuit 34 is provided and includes transistors 36, 38 which can have different threshold voltages. Such circuit comprises a portion of precharge circuitry for dynamic random access memory circuitry. In the example of FIG. 6, the transistor 36 has a low threshold voltage $V_{t1}$, and the transistor 38 has a high threshold voltage $V_{th}$.

Figure 7:
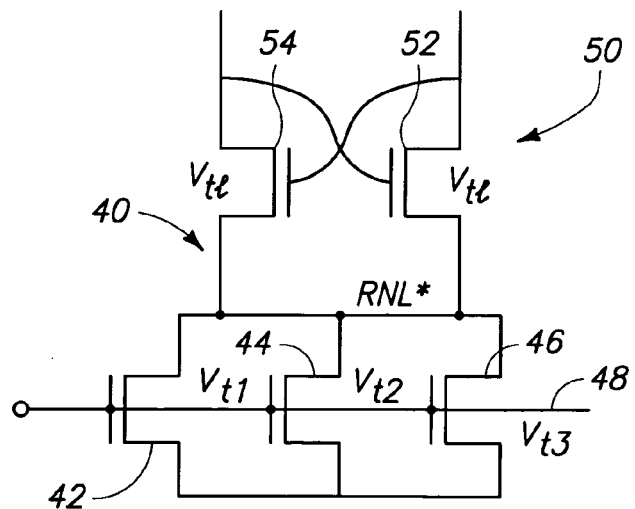
FIG. 7 is a schematic diagram of circuitry formed in accordance with another embodiment of the invention.

Referring to FIG. 7, a circuit is shown generally at 40 and comprises transistors 42, 44 and 46 having threshold voltages $V_{t1}$, $V_{t2}$ and $V_{t3}$, respectively. The transistors 42, 44 and 46 are fabricated to be formed in a parallel configuration with a common gate line 48 interconnecting the transistors 42, 44 and 46 and coupling a signal $C_{SAL}$ to gates of the transistors. In this example, the transistors 42, 44, 46 each have different active area widths which results in different threshold voltages.

Also shown in FIG. 7 is a sense amplifier circuit 50 including cross-coupled transistors 52 and 54. In one embodiment, the transistors 52 and 54 are formed to have a low threshold voltage $V_{t1}$. When the signal $C_{SAL}$ goes to logic "1", the common node labeled RNL* equilibrates the potentials on sources of the transistors 52 and 54 in preparation for reading stored data from memory cells in a memory array (not shown). In the example shown in FIG. 7, the circuit 40 acts as a pull-down circuit and equilibrates the node RNL* to ground. Use of multiple transistors 42, 44 and 46 having different threshold voltages facilitates ("softens") sensing at the beginning of the sensing cycle and also more rapid sensing at the end of the cycle when differential signals have been developed by the transistors 52 and 54.

Advantages of the invention can include provision of a plurality of transistors having different threshold voltages, without the necessity of providing different dedicated processing steps to achieve such different threshold voltages. In various preferred embodiments, such results are attained through the use of shallow trench isolation and various so-called reverse narrow width characteristics. Additionally, current drive can be achieved using multiple narrow width devices in parallel of the same or differ $V_t$. The invention can be useful for low threshold voltage applications such as precharge circuitry in DRAM circuitry, or as output drivers where low threshold voltages are important to obtain higher signal levels.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A transistor assembly comprising:
   an active area;
   a plurality of spaced-apart shallow trench isolation regions received by the active area and defining active sub-areas therebetween, individual active sub-areas having respective widths, at least one of the widths being no greater than about one micron and at least one other sub-area having a width which is different from the one width; and
   a gate line extending over the one and the other sub-area and defining, in part, separate transistors, wherein each of the separate transistors has a different threshold voltage.

2. The transistor assembly of claim 1, wherein each active sub-area width of an associated transistor is no greater than about one micron.

3. The transistor assembly of claim 1, wherein each active sub-area width of an associated transistor is no greater than about one micron, wherein more than two separate transistors have different threshold voltages.

4. The transistor assembly of claim 1, wherein said gate line comprises a common gate line which extends over a plurality of the active sub-areas defining a plurality of transistors, each active sub-area width of an associated transistor being no greater than about one micron.

5. The transistor assembly of claim 1, wherein said gate line comprises a common gate line which extends over a plurality of the active sub-areas defining a plurality of transistors, each active sub-area width of an associated transistor being no greater than about one micron and said plurality of transistors being joined in a parallel configuration.

6. The transistor assembly of claim 1, wherein the gate line extends in a direction over the one and the other sub-area, and wherein the widths of the sub-areas are defined along the direction.

7. The transistor assembly of claim 1, wherein the respective widths of the individual active sub-areas are less than one micron.

8. The transistor assembly of claim 1, wherein the separate transistors comprise an electrically parallel circuit configuration.

9. The transistor assembly of claim 1, wherein the gate line comprises a separate and distinct gate line for each of the one and the other sub-areas.

10. The transistor assembly of claim 1, wherein the separate transistors comprise transistors of a single geometry type.

11. The transistor assembly of claim 1 further comprising a sense amplifier formed from the separate transistors, each one of the separate transistors having a gate that is cross-coupled to a drain of another of the separate transistors, and wherein sources of the separate transistors are coupled to a common node.

12. The transistor assembly of claim 1, wherein the separate transistors are joined in a parallel configuration to provide a pull down circuit coupled to a common node.

13. The transistor assembly of claim 1, wherein at least one of the separate transistors is configured as precharge circuitry.

14. The transistor assembly of claim 1, wherein the separate transistors are configured as dynamic random access memory circuitry.

15. The transistor assembly of claim 1, wherein the separate transistors are electrically coupled with one another, and one of the separate transistors has a source/drain region, and an other of the separate transistors has a transistor gate electrically coupled with the source/drain region.

16. The transistor assembly of claim 1, wherein the shallow trench isolation regions have the same physical configuration.

17. The transistor assembly of claim 1, wherein the shallow trench isolation regions have the same physical dimensions.

18. The transistor assembly of claim 1, wherein at least one of the shallow trench isolation regions is configured as a trapezoid.

* * * * *

UNITED STATES PATENT AND TRADEMARK OFFICE
CERTIFICATE OF CORRECTION

PATENT NO. : 7,294,903 B2 Page 1 of 1
APPLICATION NO. : 11/216915
DATED : November 13, 2007
INVENTOR(S) : Tran It is certified that error appears in the above-identified patent and that said Letters Patent is hereby corrected as shown below:

On the Title Page Item (63), under "Related U.S. Application Data", delete "7,189,609." and insert -- 7,253,047. --, therefor.

In column 1, line 16, delete "7,189,609" and insert -- 7,253,047 --, therefor.

Signed and Sealed this

Twenty-fifth Day of March, 2008

JON W. DUDAS
*Director of the United States Patent and Trademark Office*